(12) United States Patent
Bischoff et al.

(10) Patent No.: US 7,645,522 B2
(45) Date of Patent: Jan. 12, 2010

(54) COPPER BONDING OR SUPERFINE WIRE WITH IMPROVED BONDING AND CORROSION PROPERTIES

(75) Inventors: Albrecht Bischoff, Bruchköbel (DE); Heinz Förderer, Großkrotsenburg (DE); Lutz Schräpler, Karlstein (DE); Frank Krüger, Bruchköbel (DE)

(73) Assignee: W.C. Heraeus GmbH, Hanau (DE)

( * ) Notice: Subject to any disclaimer, the term of this patent is extended or adjusted under 35 U.S.C. 154(b) by 0 days.

(21) Appl. No.: 11/851,407

(22) Filed: Sep. 7, 2007

(65) Prior Publication Data

US 2008/0076251 A1    Mar. 27, 2008

Related U.S. Application Data

(63) Continuation of application No. PCT/EP2006/001713, filed on Feb. 24, 2006.

(30) Foreign Application Priority Data

Mar. 8, 2005    (DE) .................. 10 2005 011 028

(51) Int. Cl.
*H01L 23/49* (2006.01)
*B32B 15/02* (2006.01)
*B21C 1/00* (2006.01)

(52) U.S. Cl. .................. 428/606; 428/607; 428/610; 428/941; 257/673; 228/180.22; 72/47; 148/432; 148/537; 427/120; 427/383.7

(58) Field of Classification Search .................. None
See application file for complete search history.

(56) References Cited

U.S. PATENT DOCUMENTS

| 2,989,578 | A | * | 6/1961 | Wagner et al. ............... 257/762 |
| 3,157,539 | A | * | 11/1964 | Dreher ....................... 148/536 |
| 2002/0113322 | A1 | * | 8/2002 | Terashima et al. ........... 257/784 |
| 2003/0113574 | A1 |   | 6/2003 | Liao |
| 2004/0014266 | A1 | * | 1/2004 | Uno et al. .................... 438/200 |
| 2004/0245320 | A1 | * | 12/2004 | Fukagaya et al. ......... 228/110.1 |
| 2005/0151253 | A1 |   | 7/2005 | Nonaka et al. |

FOREIGN PATENT DOCUMENTS

| EP | 1 279 491 A1 | 1/2003 |
| EP | 1447842 A | 8/2004 |

(Continued)

OTHER PUBLICATIONS

G.G. Harman; Wire Bonding in Microelectronics; Chapters 1, 4 and 8; pp. 1-10, 67-89, 203-222; McGraw-Hill (1997).

*Primary Examiner*—John J Zimmerman
(74) *Attorney, Agent, or Firm*—Panitch Schwarze Belisario & Nadel LLP

(57) ABSTRACT

A bonding or superfine wire is provided made of copper, with a gold enrichment on the surface thereof, in particular in an amount corresponding to a coating of at most 50 nm. The wire may be bonded by the ball/wedge method, has a copper-colored appearance, and the ball thereof after flame-off has a hardness of less than 95 according to HV0.002. In order to produce the bonding or superfine wire, a copper wire is coated with gold or a copper-gold alloy or gold is introduced into the surface of the copper wire. The wires are bonded to a semiconductor silicon chip.

14 Claims, 7 Drawing Sheets

FOREIGN PATENT DOCUMENTS

| | | | |
|---|---|---|---|
| GB | 2157607 A | | 10/1985 |
| JP | 63-56924 | * | 3/1988 |
| JP | 10098061 A | | 4/1998 |
| JP | 2003-133361 | | 5/2003 |
| WO | 03-081661 A1 | | 10/2003 |

* cited by examiner

COPPER BONDING OR SUPERFINE WIRE WITH IMPROVED BONDING AND CORROSION PROPERTIES

CROSS-REFERENCE TO RELATED APPLICATIONS

This application is a Continuation of International Application No. PCT/EP2006/001713, filed Feb. 24, 2006, which was published in the German language on Sep. 14, 2006, under International Publication No. WO 2006/094654 A1 and the disclosure of which is incorporated herein by reference.

BACKGROUND OF THE INVENTION

The present invention relates to a ball/wedge process in which a bonding or superfine wire made of copper is bonded to a semiconductor silicon chip; suitable superfine and bonding wires made of copper which are suitable for electrical connections for semiconductors; process for their manufacture and their use with semiconductors.

According to G. G. Harman, "Wire Bonding in Microelectronics", McGraw-Hill 1997, pp. 1-10, pp. 67ff and pp. 203ff, in the ball/wedge process the bonding or superfine wire is bonded to a chip using a flamed ball, which is also referred to as a free-air ball (FAB).

Bonding wires are the connecting lines to electronic semiconductor elements, such as IC processors or sensors. Semiconductor components have so-called contact pads, which can also be called bonding patches. Bonding wires preferably have a spherical broadening at one of their ends, with which the bonding or superfine wire is pressed onto the contact pad and welded in the pressed state, usually supported by ultrasound (US). The other end of the bonding or superfine wire is preferably flattened in a wedge shape after previous US-supported pressure loading. The resulting bond connection is called a stitch or wedge bond.

Bonding and superfine wires usually consist of gold, although this has poorer electrical and mechanical properties in comparison with copper or silver. The reason for this is the tarnishing property of copper, which loses its bonding capability in a short time. It is possible to store copper bonding wire under a protective gas in order to prevent tarnishing. Silver interferes with many processes and applications in the semiconductor industry and is therefore to be avoided.

For cost savings relative to gold wires, U.S. patent application publication US 2003/0113574 A1 describes gold-jacketed silver or palladium wires. Copper-gold alloys are characterized by distinctly increased hardness relative to both metals. However, this hardness is undesirable for bonding wires, since the semiconductor can be damaged by pressing the bonding or superfine wire onto the contact patches of the semiconductor. Gold-copper alloys on copper wires can lead to cracks in the silicon chip during pressing onto the contact patches.

BRIEF SUMMARY OF THE INVENTION

According to the invention, it is recognized that a gold layer of only a few atoms thick on the surface of a copper bonding wire ensures good corrosion resistance, without an increased hardness of the bonding or superfine wire and thus negatively influencing this for bonding to silicon chips.

It is an object of the present invention to further improve the ball/wedge process in which a copper bonding or superfine wire is bonded to a semiconductor silicon chip.

As a further object a particularly suitable bonding or superfine wire should be produced.

According to the invention, the object is achieved by dissolving gold in the surface of the copper wire. It is assumed that an interdiffusion takes place between the gold and the copper.

The tasks are solved with copper bonding or superfine wire, in whose surface a small amount of gold is contained, which is sufficient, on the one hand, to make the bonding or superfine wire stable in storage but, on the other hand, still soft enough not to destroy the chips during pressing onto the bonding patches.

A ball/wedge process is thus provided in which a bonding or superfine wire made of copper is bonded onto a semiconductor silicon chip, wherein the bonding or superfine wire has gold in its surface.

The FAB here should not be so hard that the chip can suffer damage when the FAB is pressed onto the chip.

In particular, the flamed ball of the copper bonding or superfine wire, which is enriched with gold in its surface, has a hardness according to HV0.002 of less than 95, preferably less than 0.85.

The formation of a hard FAB is so minimized or suppressed or prevented that the destruction of chips when pressing the bonding layer on is eliminated. A superfine copper wire is suitable for this purpose, which in its surface contains a particularly small portion of gold and which appears copper-colored and is bondable using a ball/wedge process. The wire can have a very thin gold jacketing. However, it is fully sufficient that the surface of the superfine wire contains gold along with the copper.

An inner phase boundary then no longer exists, in contrast to jacketed wires. To manufacture a copper wire with a gold concentration in its surface increasing towards the outside, a copper wire is jacketed with gold or a copper-gold alloy, and the jacketing is dissolved in the copper wire. For this purpose, the processing steps of annealing and drawing are suitable, particularly performed several times alternately after each other. The two-phased jacketed system is thus transformed into a one-phase system with a concentration gradient in its surface.

Superfine wires whose copper color is still recognizable, particularly whose copper tone is stronger than that of gold or those with a gold jacketing of at most 10 nm or which have a copper-gold alloy in their surface or whose gold proportion in the wire surface remains smaller as it would correspond to a gold application on a bonding or superfine wire with a layer thickness of less than 50 nm, particularly less than 20 nm, all exhibit a sufficiently small hardness increase, which can be tolerated when pressing onto a bonding patch.

On the other hand, surface treatment with a barely perceptible amount of gold suffices to lend the bonding or superfine wire stability in storage. Several coating processes can be used for the application of gold.

The bonding or superfine wire according to the invention, besides the good electrical and mechanical properties of copper, also exhibits the additional storage stability, and indeed without the FAB of the wire being significantly harder. Here it is the case of a surface-treated copper bonding wire whose surface contains gold. The better mechanical and electrical properties of copper relative to gold, as well as the tarnishing stability relative to pure copper, now make it possible to use thinner bonding wires. This contributes to material savings, on the one hand, and on the other hand, to further reduction in dimensioning of semiconductors and processors.

The bonding or superfine wire according to the invention has almost the same electrical conductivity as the purest copper.

The loop pull-off strength corresponds to the loop pull-off strength of the purest or slightly doped copper wires.

In a preferred embodiment, the surface of the gold-copper alloy has a gradient in which the gold concentration becomes maximum on the outside. This further contributes to minimizing the gold portion and its contribution to an increased hardness while maintaining corrosion stability.

For manufacture of the wire according to the invention, any conventional process is suitable in which gold or gold-copper alloy is applied to a copper wire, and in the case of a pure gold application the gold is worked into the surface of the copper, insofar as an extremely small portion of gold remains on or in the surface of the bonding or superfine wire. Known thermal, electrochemical, mechanical, or plasma processes are suitable for this purpose.

In a preferred embodiment, layers of very pure gold can be formed up to 15 nm, particularly up to 10 nm, and most preferably up to 5 nm thick.

The manufacture of these corrosion-resistant bonding wires, whose surface is treated with gold, can be performed according to current coating methods, and attention should preferably be paid to the uniformity of the surface. The advantages of the present invention are plainer the thinner the bonding or superfine wire is. Thus, the preferred application is found in wires with a diameter of up to 100 µm. Extreme quality improvements are achieved with wires having a diameter less than 50 µm and many applications for such thin bonding wires are only now possible.

According to the invention, bonding wires can be manufactured, in which the treatment with gold is performed in such a way, that the color of the copper is more distinct to the observer than that of the gold. Accordingly, copper wires are produced whose surface indeed contains gold, but whose color impression is rather more like copper than like gold.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown. In the drawings.

DETAILED DESCRIPTION OF THE INVENTION

Comparative Examples

Figure 1:
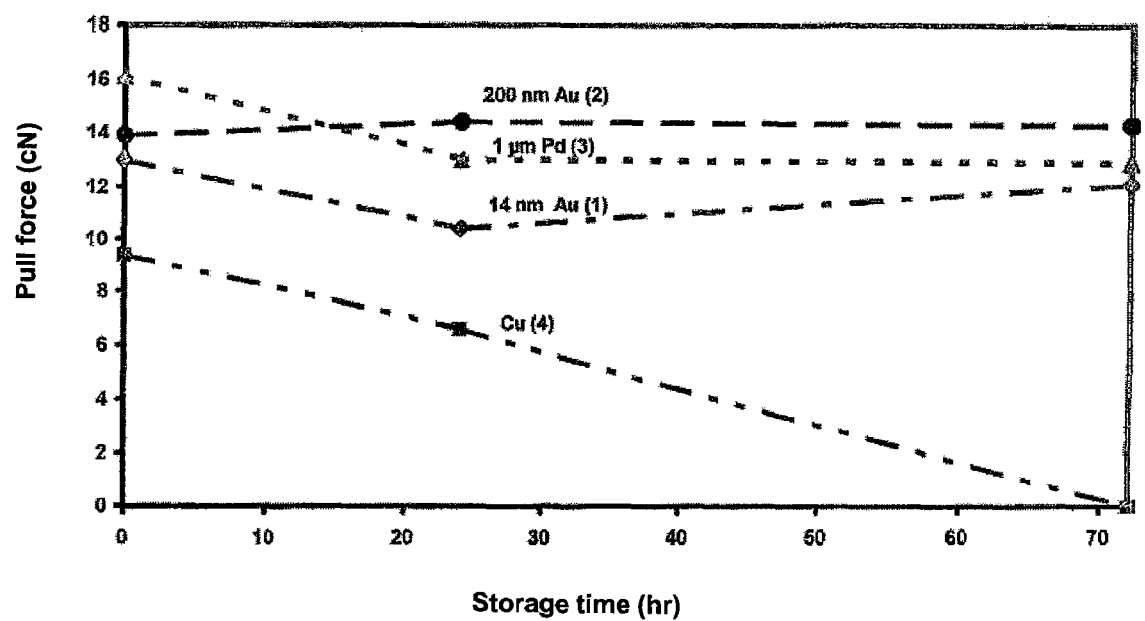
FIG. 1 is a graph of pull force vs. storage time, illustrating the storage stability of copper bonding wires in comparison with coated copper bonding wires at 70° C. in air.
Figure 2:
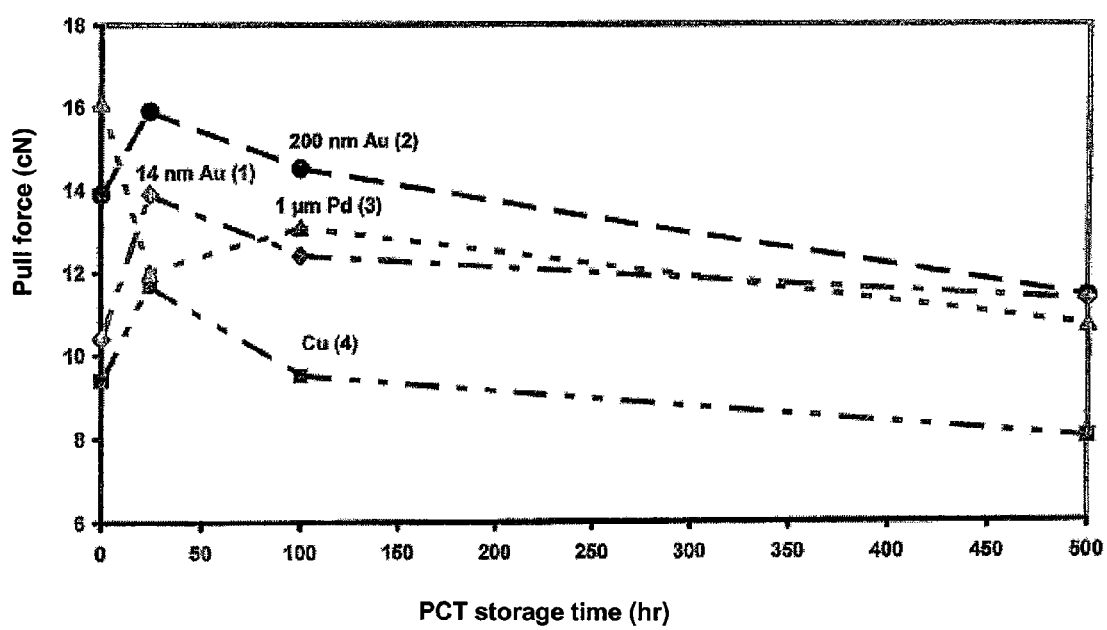
FIG. 2 is a graph of pull force vs. PCT storage time, illustrating the corrosion resistance of the bonding wires of FIG. 1 under standard conditions.

Pure copper wire loses its bonding capability due to corrosion, as shown in FIGS. 1 and 2.

Figure 3:
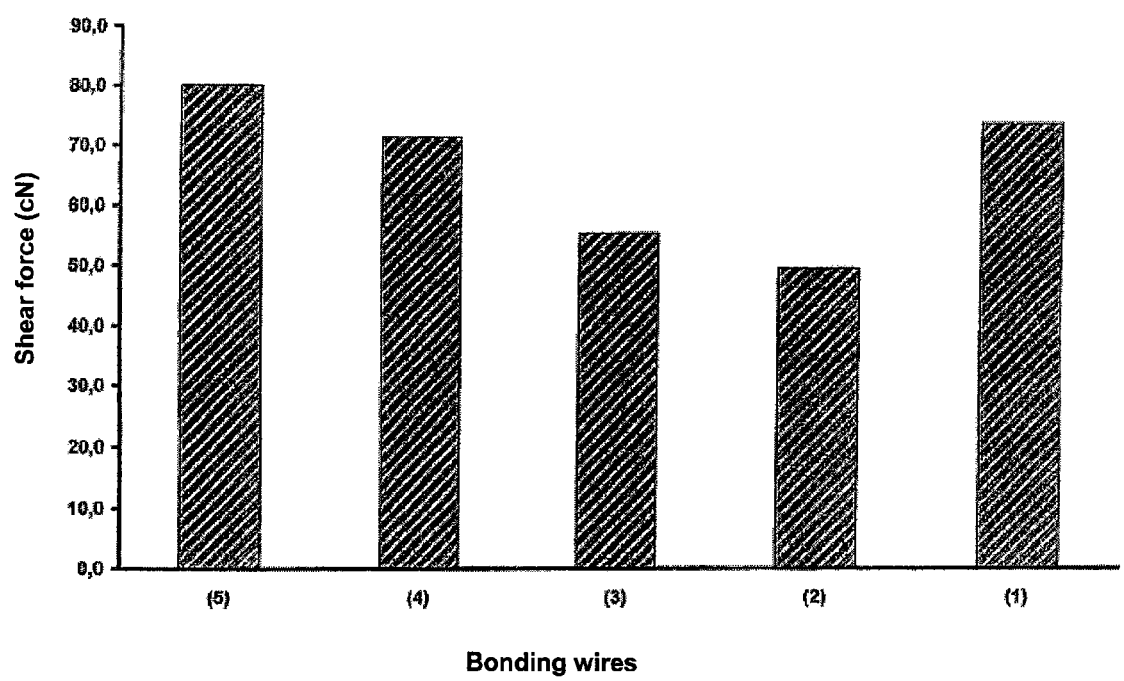
FIG. 3 is a histogram, illustrating the shear-off strength of uncoated and coated copper bonding wires.
Figure 6:
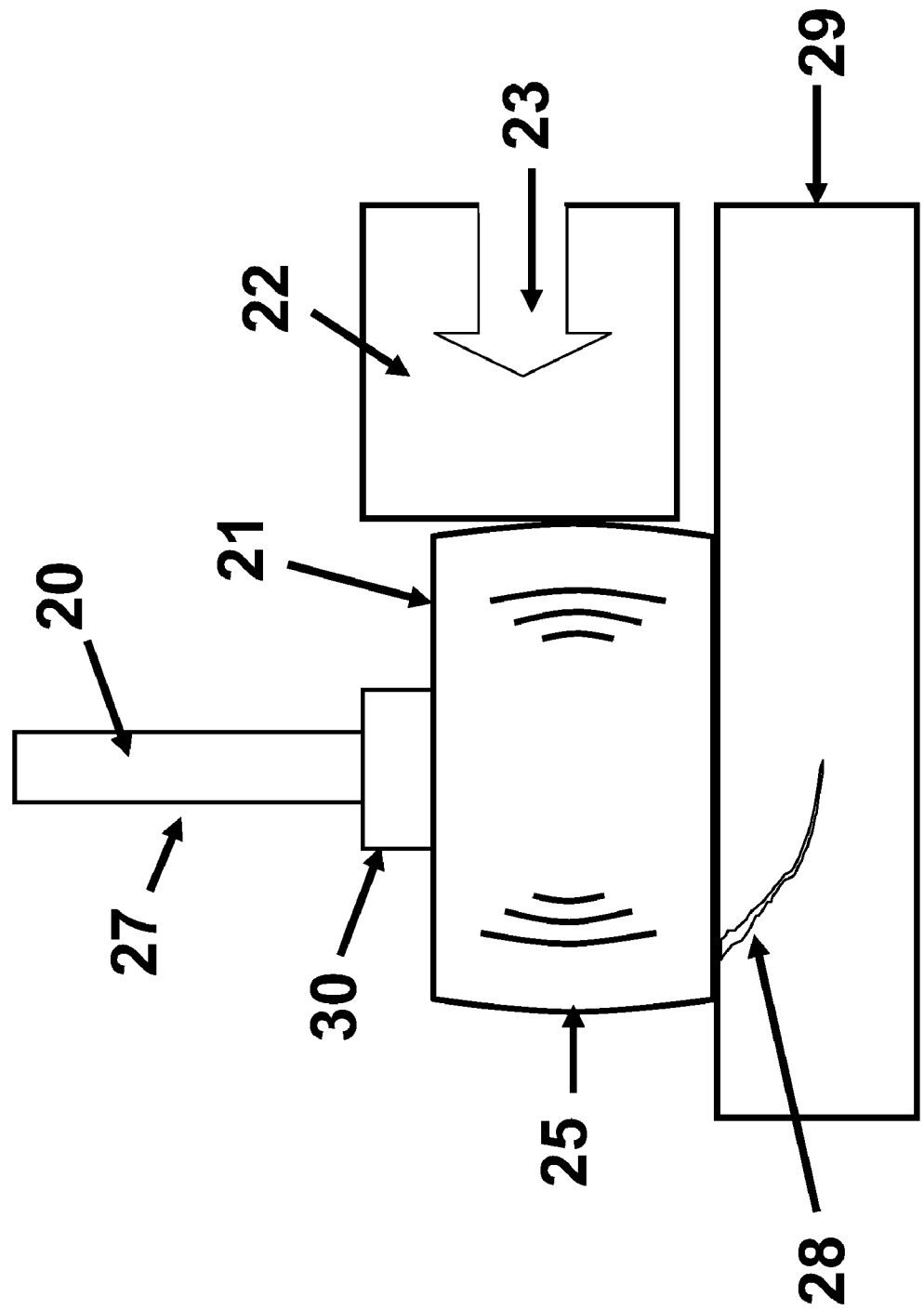
FIG. 6 is a schematic illustration similar to FIGS. 4 and 5 showing, in comparison, a bonding patch with a damaged chip after ball bonding.

FIG. 3 shows that the shear forces 23 of coated copper wires of the prior art are low. The reason for this lies in the damage 28 of the chip. During schear-off, even at low shear forces 23, the damaged chip 28 breaks. A bonding patch 28 damaging the chip is shown in FIG. 6.

Figure 7:
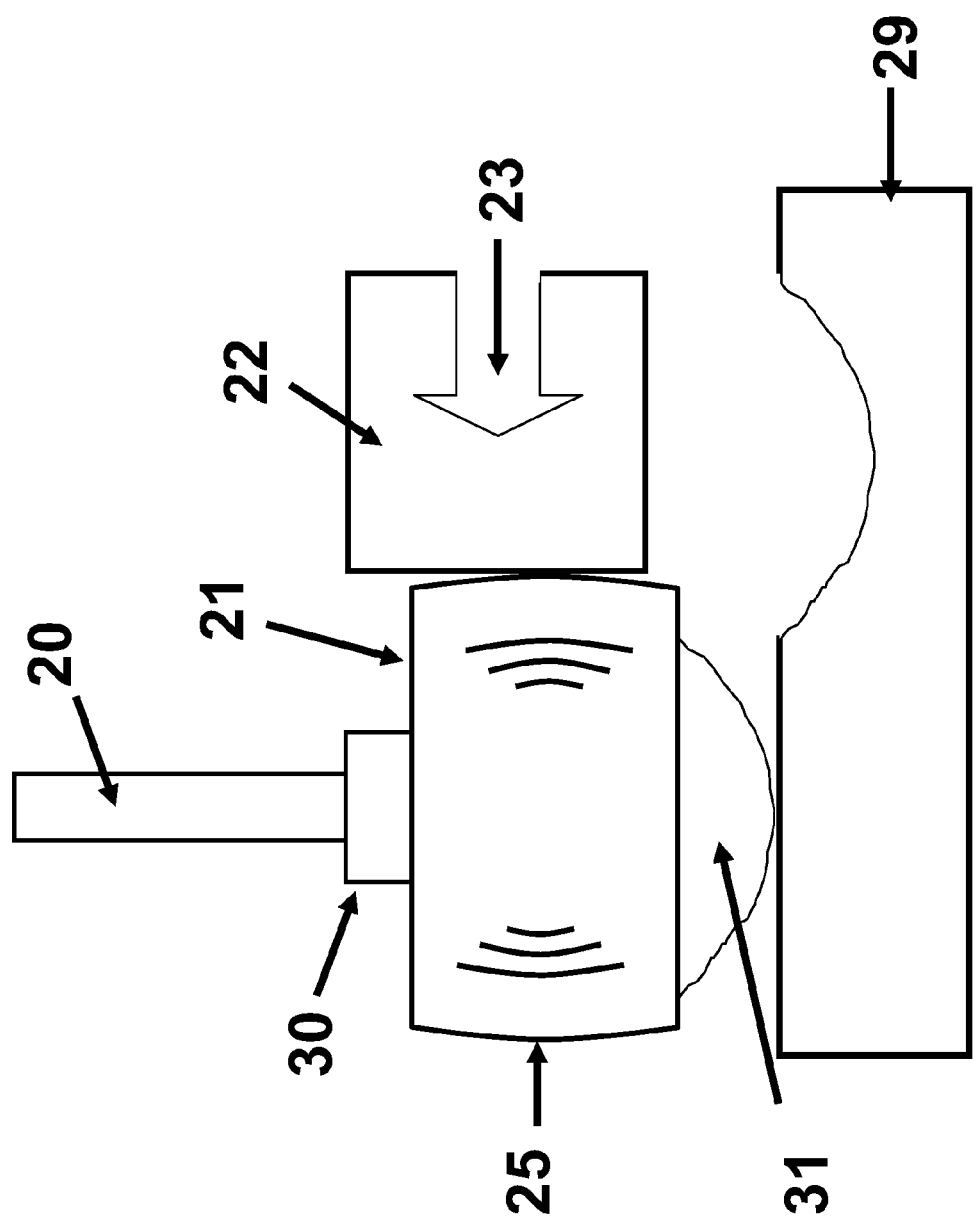
FIG. 7 is a schematic illustration of the bonding patch of FIG. 6, showing the damaged chip after schear-off of the bonding patch.

FIG. 7 shows the chip with the damaged bonding patch 28 after the schear-off process. Here, it can be seen that, after schear-off of the bonding patch from the chip 28 damaged by the bonding patch, the surface 31 of the chip has broken off.

Example 1

From FIGS. 1 and 2 it can be seen that a copper bonding or superfine wire according to an embodiment of the invention is corrosion stable with a 14 nm gold coating 1, and has a loop schear-off force comparable to bonding wires made of pure gold or pure copper. Thus, the bonding wires according to the invention are corrosion-stable relative to pure copper wires 4 and have an improved conductivity and improved stability relative to gold bonding wires. In an inventive manner, a choice was made between the possibilities of alloying or coating copper with gold, in which the increasing hardness of gold-copper alloys plays no role upon bonding, and therefore the chips 29 to be bonded are not damaged when pressing on the bonding or superfine wire.

The ball 21 provided for the bonding process remains soft, despite the corrosion protection, although gold-copper alloys are considered hard.

Example 2

Cu-wire of 99.995% purity is electrolytically coated. The Cu-wire output diameter is 250 µm.

The Au-coated wires are pulled to 25 µm thickness by repeated pulling. In a subsequent pass-through annealing, the wires are set to a tearing load of 13 cN with a resulting breaking stretch of 14% ("soft condition"). To prevent oxidation of the freshly pulled wires, coils are vacuum-welded in PE film.

The wire used here would have a coating 20 nm thick, if the gold did not diffuse into the copper, or the copper into the gold. The diffusion obscures the phase boundary, so that a layer thickness can only be given for a fictitious jacketing, which is not real due to the diffusion. The wire obtained is copper-colored. Thus, when describing the invention, the designation gold-enriched surface is used instead of the expression gold jacketing or coating.

Example 3

The above-mentioned bonding wires 20 are subjected to open storage and after a predetermined period of time undergo a bonding test per ASTM, 100 Barr Harbor Drive, West Conshohocken, Pa. 19428-2959 and G. G. Harman, "Wire Bonding in Microelectronics," McGraw-Hill 1997, pp 67ff.

The bonding conditions are as follows:
Ball-wedge bonder (ESEC 3088) with the bonding parameters:
   a) Ball side (impact 2000; force 3000; time 32; US 80) and
   b) Wedge side (impact 300; force 1500; time 30; US 20)
The numeric specifications are bonder parameters.
As a substrate are used:
1. Gold-jacketed Cu—$Sn_6$ substrate
2. Al-metallized Si chip FIG. 1 shows the schear-off force resistance of the wire loops. The schear-off strength is determined using a pull tester (DAGE BT 22) and the so-called hook test MIL STD 883F, Jun. 18, 2004, Microcircuits, Method 2011.7.

The diagram in FIG. 1 shows a comparative storage resistance of a 14 nm Cu—BW 1 as a massive gold wire, a 200 nm Au-coated 2 and a 1 μm Pd-coated 3 bonding or superfine wire (BW). In contrast, the bondability of the uncoated Cu—BW 4 falls to 0 within 3 days (pull force=0). The diagram shows the pull forces (cN) depending on the storage time at 70° C. in air.

Example 4

The aforementioned Au-coated Cu—BW is subjected in the bonded state (under the bonding conditions described in Example 1) to a pressure cooker storage treatment (PCT); JEDEC (EIA) Solid State Products Engineering Council, 2500 Wilson Blvd., Arlington, Va. 22201; EIAS-IC-121-18 and G. G. Harman, "Wire Bonding in Microelectronics," McGraw-Hill 1997, pp. 67ff. (Conditions: 121° C., 2 bar, distilled water)

The examination is performed comparatively with massive Au and Cu wires and the coated Cu wire conditions described in Example 1.

After predetermined time intervals, samples are taken and subjected to a hook test with the Dage pull tester mentioned above.

FIG. 2 shows application of the schear-off values (pull force in cN) in comparison with the massive, thick Au or Pd-coated wires.

The comparative corrosion resistance of the 14 nm Au 1 coated wire with the thick Au 2 or Pd 3 coated wires is clear. There is significantly higher corrosion resistance in comparison with the uncoated Cu wire 4.

Example 5

Figure 4:
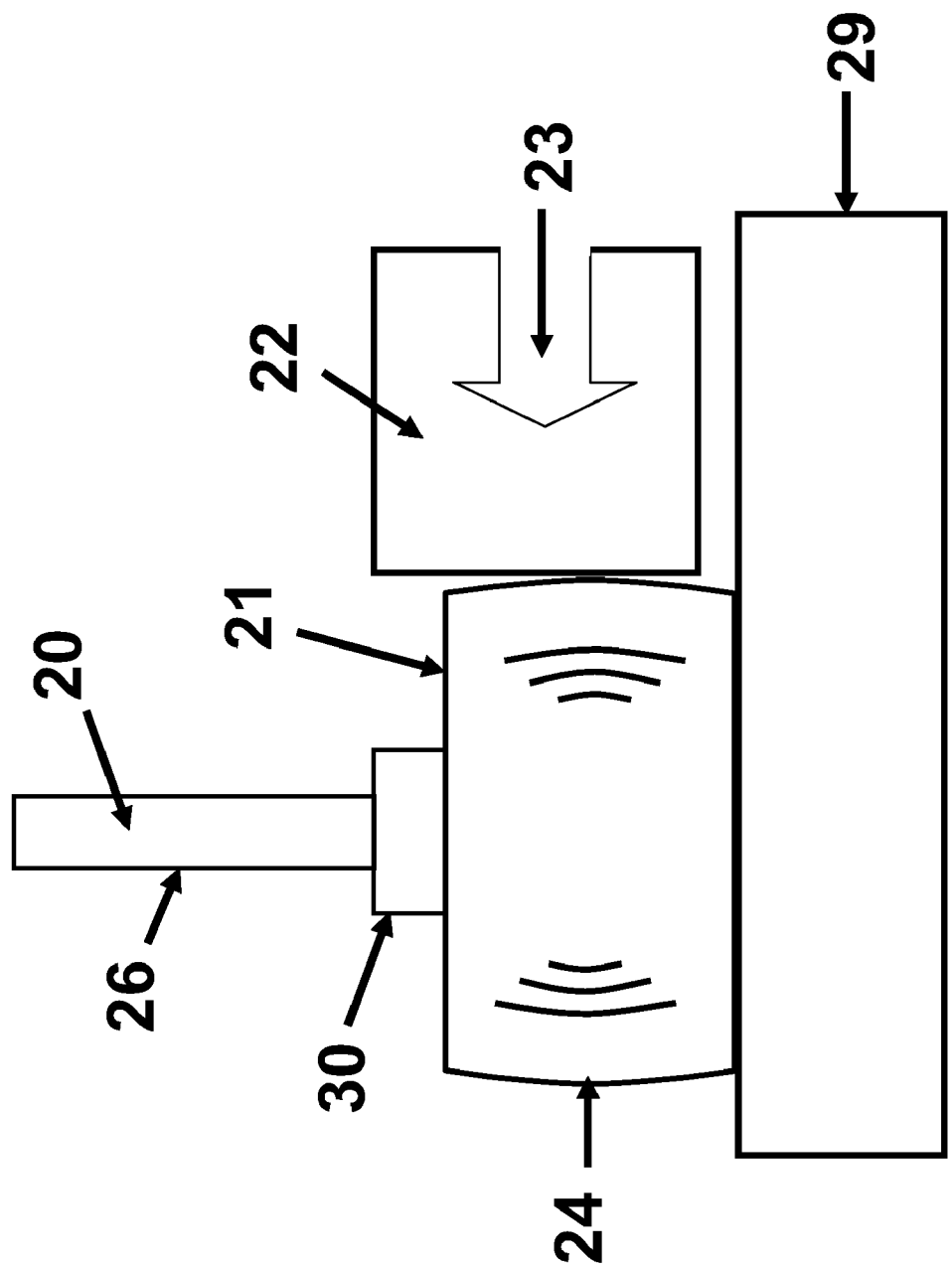
FIG. 4 is a schematic illustration of a bonding patch of a bonding or superfine wire according to an embodiment of the invention on a chip.

Flamed spheres (FAB) 24, 25 of the above-mentioned wires 20 are bonded under identical bonding conditions (see Example 1) onto the Al-metallized chip 29. FIG. 4 shows a bonding or superfine wire bonded on the chip.

The shear force 23 and the crack formation demonstrated by REM indicate the influence of the wire condition on susceptibility to damage 28 of the silicon of the chip (cratering susceptibility).

The histogram in FIG. 3 shows high shear forces for the 14 nm Au-coated Cu BW 1, comparable with massive Au—BW 5 and the Pd-coated 3 or uncoated Cu—BW 4. The too-thick 27 Au-coated Cu BW 2, in contrast, exhibits lower shear force values 23 connected with cracks 28 in the Si chip. The crack location was performed with REM in combination with EDX. The latter shows a clear Si crack surface on the substrate side (see the schematic representation in FIGS. 4-7).

The reason for this crack mode is the hardness increase of the FAB 25 due to dissolved Au, which leads to an increased tendency of crack formation 28 in the silicon of the chip (FIG. 6). The subsequent shear test creates crack expansion in the Chip and a break 31 in the silicon (FIG. 7).

Figure 5:
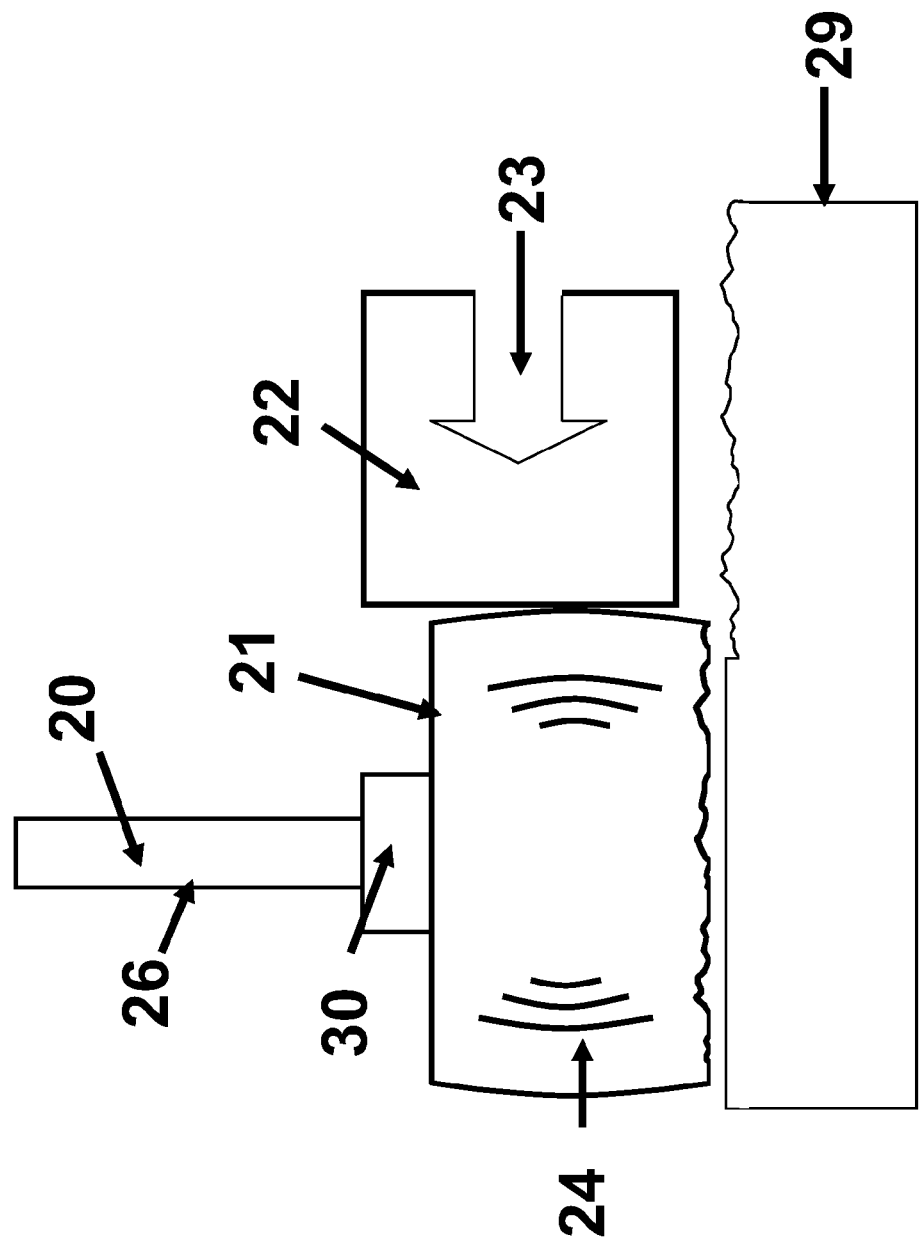
FIG. 5 is a schematic illustration of the chip in FIG. 4 after the bonding patch has torn off.

In contrast hereto, the thin Au-coated Cu—BW 26 (V9) shows a separation in the interface between the ball 24 and silicon 29 (in the Al-coated region). This is shown in FIG. 5.

The overall results of the examples are listed in Table 1.

TABLE 1

| | | Reliability criteria | | | |
|---|---|---|---|---|---|
| Coating of Cu | Storage resistance | Loop corrosion resistance (PCT | Ball-bondability (indication of scalloped break risk) | | |
| BW (thickness) | before bonding | test) | Shear force | Break mode | Hardness |
| Uncoated | (−) | (−) | (++) | Ball shear | low |
| Pd (1 μm) | (+) | (+) | (+) | Ball shear | low |
| Au (200 nm) | (++) | (++) | (−) | Ball lift (break in silicon) | high |
| Au (14 nm) | (+) | (+) | (++) | Ball lift | medium |

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A bonding or superfine wire, comprising a copper wire having gold enriched in a surface of the wire, wherein the bonding or superfine wire comprises a single phase system.

2. A bonding or superfine wire, comprising a copper wire containing gold in its surface, wherein the bonding or superfine wire comprises a single phase system and is bondable using a ball/wedge process.

3. A bonding or superfine wire according to claim 1, wherein a quantity of gold enriched in the surface of the wire corresponds to a jacketing of at most 50 nm, if the gold were a uniform layer on the wire.

4. The bonding or superfine wire according to claim 3, wherein the quantity of gold enriched in the wire surface corresponds to a jacketing of at most 20 nm, if the gold were a uniform layer on the wire.

5. The bonding or superfine wire according to claim 1, wherein the bonding or superfine wire has a copper-colored appearance.

6. The bonding or superfine wire according to claim 1, wherein the wire has a diameter of 25 μm and in a bonded-on condition has a loop schear-off strength>10 cN in a subsequent pressure cooker test (PCT) over 500 hrs.

7. The bonding or superfine wire according to claim 1, wherein a concentration of the gold in the surface of the wire decreases toward its interior.

8. The bonding or superfine wire according to claim 1, wherein the wire enriched with gold in its surface has a form of a flamed ball, wherein the flamed ball has a hardness according to HV0.002 of less than 95.

9. A ball/wedge process, the process comprising bonding a bonding or superfine wire made of copper onto a semiconductor silicon chip, wherein the wire is enriched with gold in its surface and comprises a single phase system.

10. A process for improving corrosion resistance of a bonding or superfine wire made of copper, the process comprising treating the copper wire with gold on its surface during manufacture of the bonding or superfine wire such that the treated bonding or superfine wire comprises a single phase system.

11. The process according to claim 10, wherein the gold is worked into the surface of the copper wire.

12. The process according to claim 10, wherein the gold is applied to the surface of the copper wire, or worked into its surface, in such a small amount that copper color in the bonding or superfine wire is still recognizable.

13. The bonding or superfine wire according to claim 1, wherein the wire is storage stable for more than 100 hours unprotected from atmospheric influence.

14. A bonding or superfine wire manufactured according to the process of claim 10, wherein the wire is storage stable for more than 100 hours unprotected from atmospheric influence.

* * * * *